US006602349B2

(12) United States Patent
Chandra et al.

(10) Patent No.: US 6,602,349 B2
(45) Date of Patent: Aug. 5, 2003

(54) SUPERCRITICAL FLUID CLEANING PROCESS FOR PRECISION SURFACES

(75) Inventors: Mohan Chandra, Merrimack, NH (US); David J. Mount, North Andover, MA (US); Michael A. Costantini, Hudson, NH (US); Heiko D. Moritz, Nashua, NH (US); Ijaz Jafri, Nashua, NH (US); Jim Boyd, Amherst, NH (US); Rick M. Heathwaite, Manchester, NH (US)

(73) Assignee: S.C. Fluids, Inc., Nashua, NH (US)

( * ) Notice: Subject to any disclaimer, the term of this patent is extended or adjusted under 35 U.S.C. 154(b) by 218 days.

(21) Appl. No.: 09/861,298

(22) Filed: May 18, 2001

(65) Prior Publication Data

US 2002/0014257 A1 Feb. 7, 2002

Related U.S. Application Data

(63) Continuation-in-part of application No. 09/632,770, filed on Aug. 4, 2000, now Pat. No. 6,508,259, which is a continuation-in-part of application No. 09/665,932, filed on Sep. 20, 2000, now Pat. No. 6,334,266, which is a continuation-in-part of application No. 09/837,507, filed on Apr. 18, 2001.
(60) Provisional application No. 60/147,251, filed on Aug. 5, 1999, provisional application No. 60/155,454, filed on Sep. 20, 1999, provisional application No. 60/267,916, filed on Feb. 9, 2001, provisional application No. 60/197,519, filed on Apr. 18, 2000, and provisional application No. 60/205,335, filed on May 18, 2000.

(51) Int. Cl.[7] .................................................. B08B 7/00
(52) U.S. Cl. .............................. 134/19; 134/30; 134/34; 134/902
(58) Field of Search .............................. 134/19, 30, 34, 134/36, 37, 902

(56) References Cited

U.S. PATENT DOCUMENTS

| | | | |
|---|---|---|---|
| 3,968,885 A | 7/1976 | Hassan et al. | 214/1 BC |
| 4,355,937 A | 10/1982 | Mack et al. | 414/217 |
| 4,827,867 A | 5/1989 | Takei et al. | 118/64 |
| 4,944,837 A | 7/1990 | Nishikawa et al. | 156/646 |
| 5,013,366 A | 5/1991 | Jackson et al. | 134/1 |
| 5,071,485 A | 12/1991 | Matthews et al. | 134/2 |

(List continued on next page.)

FOREIGN PATENT DOCUMENTS

| | | |
|---|---|---|
| JP | 04017333 A * | 1/1992 |
| WO | WO99/49996 | 10/1999 |
| WO | WO 99/49998 | 10/1999 |
| WO | WO 01/82368 A2 | 11/2001 |

OTHER PUBLICATIONS

PCT International Search Report dated Aug. 30, 2001 of International Application No. PCT/US01/15999 filed May 18, 2001.

*Primary Examiner*—Randy Gulakowski
*Assistant Examiner*—Joseph Perrin
(74) *Attorney, Agent, or Firm*—Maine & Asmus

(57) ABSTRACT

A dry process for the cleaning of precision surfaces such as of semiconductor wafers, by using process materials such as carbon dioxide and useful additives such as cosolvents and surfactants, where the process materials are applied exclusively in gaseous and supercritical states. Soak and agitation steps are applied to the wafer, including a rapid decompression of the process chamber after a soak period at higher supercritical pressure, to mechanically weaken break up the polymers and other materials sought to be removed, combined with a supercritical fluid flush to carry away the loose debris.

27 Claims, 10 Drawing Sheets

U.S. PATENT DOCUMENTS

| | | | |
|---|---|---|---|
| 5,169,408 A | 12/1992 | Biggerstaff et al. | 29/25.01 |
| 5,261,965 A | 11/1993 | Moslehi | 134/1 |
| 5,306,350 A | 4/1994 | Hoy et al. | 134/22.14 |
| 5,314,574 A | 5/1994 | Takahashi | 156/646 |
| 5,368,171 A | 11/1994 | Jackson | 134/147 |
| 5,401,322 A | 3/1995 | Marshall | 134/13 |
| 5,417,768 A | 5/1995 | Smith, Jr. et al. | 134/10 |
| 5,494,526 A | 2/1996 | Paranjpe | 134/1 |
| 5,505,219 A | 4/1996 | Lansberry et al. | 134/105 |
| 5,509,431 A | 4/1996 | Smith, Jr. et al. | 134/95.1 |
| 5,514,220 A | 5/1996 | Wetmore et al. | 134/22.18 |
| 5,522,938 A | 6/1996 | O'Brien | 134/1 |
| 5,783,082 A | 7/1998 | DeSimone et al. | 210/634 |
| 5,868,862 A | 2/1999 | Douglas et al. | 134/26 |
| 5,873,948 A | 2/1999 | Kim | 134/19 |
| 5,881,577 A | 3/1999 | Sauer et al. | 68/5 |
| 5,908,510 A | 6/1999 | McCullough et al. | 134/2 |
| 5,944,996 A | 8/1999 | DeSimone et al. | 210/634 |
| 5,976,264 A | 11/1999 | McCullough et al. | 134/2 |
| 6,024,801 A | 2/2000 | Wallace et al. | 134/2 |
| 6,085,762 A | 7/2000 | Barton | 134/25.4 |
| 6,090,217 A | 7/2000 | Kittle | 134/11 |
| 6,092,538 A | 7/2000 | Arai et al. | 134/1.3 |
| 6,425,956 B1 * | 7/2002 | Cotte et al. | 134/3 |

* cited by examiner

SUPERCRITICAL FLUID CLEANING PROCESS FOR PRECISION SURFACES

This application relates and claims priority for all purposes to pending U.S. applications Ser. No. 60/205,335, filed May 18, 2000, Ser. No. 60/267,916, filed Feb. 9, 2001, Ser. No. 60/197,519 filed Apr. 18, 2000, and is continuation-in-part of Ser. No. 09/837,507, filed Apr. 18, 2001, Ser. No. 09/632,770 filed Aug. 4, 2000, now U.S. Pat. No. 6,508,259 Ser. No. 60/147,251 filed Aug. 5, 1999, Ser. No. 60/155,454 filed Sep. 20, 1999, and Ser. No. 09/665,932 filed Sep. 20, 2000 now U.S. Pat. No. 6,334,266.

FIELD OF INVENTION

This invention relates to methods for cleaning precision surfaces of wafers with supercritical fluids; and in particular to methods of cleaning wafers using rapid decompression techniques at supercritical state combined with full flow washing action.

BACKGROUND

Semiconductor device manufacturing or IC fabrication requires precisely controlled quantities of impurities to be introduced into tiny regions of the silicon substrate. Subsequently these regions must be interconnected to create components and electronic circuits. Lithographic processes create the patterns that define such regions. That is, a layer of photoresist materials is first spin-coated onto the wafer substrate. Next, this resist is selectively exposed to radiation such as ultraviolet light, electrons, or x-rays. An exposure machine, called stepper, and mask, called reticule, are used to effect the desired selective exposure. The patterns in the resist are formed when the wafer undergoes a subsequent development step. The areas of resist remaining after development protect the substrate regions, which they cover.

Locations from which resist has been removed can be subjected to a variety of subtractive (e.g. etching) or additive (e.g. ion implantation) processes that transfer the pattern onto the substrate surface. An advance integrated circuit can have up to 30 or more masking layers. Approximately one-third of the total cost of semiconductor manufacturing can be attributed to microlithographic processing; ref. *Silicon Processing for the VLSI Era*, S. Wolf and R. N. Tauber, Vol. 1, $2^{nd}$ edition, Lattice Press, Sunset Beach, Calif., 2000, pp. 488, incorporated herein by reference.

The above mentioned residues are required to built up in the manufacturing process. Sidewall polymers, also called veils or via veils are a beneficial by-product, or artifact of RIE providing means for anisotropic etch to produce high aspect ratio vias. Compositionally sidewall polymers are generally low molecular weight fluoropolymers, that form from a combination of ion bombardment of the photoresist mask and fluorine in the etch gas chemistry. Upon backsputtering from the via base metal ions are incorporated in the via veil, which tend to oxidize at high temperature (250° C. to 400° C.) oxygen plasma based photoresist stripping to become insoluble.

After etching (wet or dry) or ion implantation photoresist has to be removed. There are different degrees of difficulty required to do this, depending on the prior process. High-temperature hard bakes, plasma etch residues, sidewall polymers in contact holes and electrical interconnect trenches, ion implantation crusting, shrinking feature sizes, and new polymeric types of insulating material including low-k materials, all present challenges for the resist removal process. Both wet and dry stripping methods are being used.

Plasma ashing as a dry method is currently the method of choice for the back-end of the fabrication process where the electrical interconnects are manufactured.

During plasma ashing, photoresist is removed by oxygen energized in a plasma field, which oxidizes the resist components to gases that are removed from the process chamber by a vacuum pump. Microwave, RF and UV-ozone sources generate the plasma. The disadvantage of plasma resist stripping is its ineffectiveness in the removal of metal ions and residues after dry etching, or reactive ion etching (RIE), namely sidewall polymers in vias, contact holes and trenches; ref. *Microchip Fabrication*, P. van Zant, $3^{rd}$ edition, McGraw Hill, New York, 1997, pp. 273, incorporated herein by reference.

To complete the photoresist stripping process all residues have to be removed. This is typically done in wet chemical cleaning stations. After that the wafer has to be rinsed in deionized water and is finally dried. The process is called post-strip cleans.

The problems associated with the prior art methods of photoresist stripping by plasma ashing (PA) and residue removal can be summarized as follows:

PA is performed at high temperatures of 250°–400° C., adding to the thermal budget of the wafer;

after PA residues are left in vias and trenches that need additional wet chemical treatment;

PA is not efficient for removing mobile metallic ion contamination;

PA can cause radiation damage of the electronic circuits;

PA of photoresist after ion implantation can lead to "resist popping" littering the wafer with particulate matter;

with PA, selectivity between photoresist and low-k materials is bad and low-k material may be mechanically affected;

PA can modify the dielectric constant of low-k material due to charge damage;

post-strip wet chemical treatment may modify the low-k material in its electrical properties;

shrinking dimensions of features below 0.18 µm present a problem for wet chemistry as post-strip cleans method, because of surface tension issues.

There are ongoing efforts to improve the efficiency of PA. A new process has been reported recently where during ashing fluorine-based gases are added that render residues water soluble. In a subsequent rinse step with deionized water the residues are being removed; ref. *Manufacturing Qualification of an All Dry DeVeil Process*, Richard Bersin, et al., The $197^{th}$ Meeting of the Electrochemical Society, Toronto, 2000, incorporated herein by reference. Although the process is touted "all dry", a wet rinsing step has to follow and therefore problems with surface tension of water occur for small features as is typical for wet methods.

Alternative methods are being investigated. Some of them are still wet chemical based (Chilled Ozone–IMEC, Belgium; $SO_3$+DI water rinse–Anon, USA) and therefore will have problems with processing small features. Laser stripping is a method developed in two modifications by different companies (Oramir, Israel; Radiance, USA). Both use laser energy to remove the photoresist. In one case environmentally critical process gases $NF_3$ or $CF_4$ are being added (Oramir), or inert gas is being used (Radiance). There is no indication as of today that these methods will find broad acceptance in the semiconductor industry. Other methods aim at the post-strip cleaning process with equipment either in the development phase or being used occasionally as post treatment tools (Dry Ice Spray —ATS Eco-Snow, USA; Charged Microclusters—Phrasor Scientific Inc., USA; Argon/Nitrogen Cryogenic Aerosol Cleaning—FSI International, USA).

Another technology being investigated for its obvious potential advantages is the use of supercritical fluids for wafer cleaning, particularly with carbon dioxide. This approach takes advantage of the supercritical state of a process chemical, which is another state of matter, also called phase, in addition to solid, liquid and gas. Sometimes the supercritical phase is referred to as "dense gas", "compressible liquid", or "supercritical fluid". There is considerable other art on the subject. However, there has been a dearth of understanding as to the best mode in which to apply the technology in a practical, easily automated process so as to produce the desired quality of cleaning, in the shortest amount of time, on a repetitive basis and at an affordable cost. It is this area of the art to which the following invention is directed.

In the description of the invention that follows, the supercritical phase of the process chemical is referred to as supercritical fluid. In this dense state the process substance fills the process chamber completely like a gas with the molecules interacting strongly. This leads to new properties of the process material that are crucial to the cleaning process. The supercritical state is characterized by a critical point, which constitutes of a critical pressure $p_c$ and a critical temperature $T_c$. At the critical point the density of the vapor and the liquid are identical. A material is in its supercritical state, if both, pressure and temperature are at or exceed the critical values.

Supercritical fluids have long been known for their abilities to dissolve organic contaminants. Their ability to display a wide range of solvent characteristics and the ability to tune solubility with small changes in temperature and pressure were identified early on. The gas-like diffusivity and low surface tension combined with liquid-like densities are important since these qualities enhance the cleaning effectiveness on parts, which have very small features (e.g. vias and trenches on semiconductor devices), or contain materials where selectivity of the supercritical fluid to one or the other component is a requirement, for example, between low-k material and photoresist in the fabrication of semiconductor devices; ref. *Precision Cleaning With Supercritical fluid: A Case Study*, John. E. Giles, et. al. in "Supercritical Fluid Cleaning—Fundamentals, Technology and Applications", John McHardy, Samuel P. Sawan, ed., Noyes Publications, Westwood, N.J., USA, 1998, pp. 198, incorporated herein by reference The effectiveness of supercritical fluids for cleaning can be improved. The use of binary and multi-component fluids is driven by a desire to either manipulate the critical temperature of the mixture, or to introduce polar or nonpolar features to regulate interactions of the fluid with a specific compound; ref. *Supercritical Fluid Engineering Science*, Erdogan Kiran, Joan F. Brennecke, ed., ACS Symposium Series 514, American Chemical Society, Washington, D.C. 1993, pp. 2, incorporated herein by reference.

Not withstanding all of the above, the problem of how to construct and operate an automated supercritical fluid cleaning process for satisfactory effect on semiconductor wafers and other precision surfaces remains unresolved in the prior art.

SUMMARY OF INVENTION

The invention, simply stated, is a process for cleaning precision surfaces such as the cleaning of photoresist off semiconductor wafers as part of the semiconductor fabrication process. The process relies on the use of process materials such as carbon dioxide that tend to be good solvents especially at supercritical temperature and pressure, alone or in combination with useful additives such as cosolvents and surfactants selected to shift the critical point downward or improve the cleaning effect. The process materials are applied to the substrate preferably exclusively in gaseous and supercritical states so as to avoid the problems associated with liquid contact.

Soak and agitation steps are applied to the substrate to aid both chemically and mechanically in the removal of the unwanted material from the substrate. The soak step permits infusion of the process materials into the unwanted matter at an elevated supercritical pressure. The agitation step includes a rapid decompression of the process chamber after the soak period, still within supercritical pressure, in order to mechanically weaken and break loose pieces of the photoresist, sidewall polymer and such other materials as are sought to be removed, with a very significant pressure differential. This is combined with a supercritical fluid flush to carry away the loose debris, and is then preferably concluded by rapidly elevating the vessel pressure back to the higher supercritical pressure, stressing the unwanted material this time with rapid compression. The core process steps are preceded and followed by more conventional loading and unloading steps, except that the purging and pressurization steps avoid any liquid contact with the substrate, constraining the inflowing process materials to process gas and supercritical fluid.

It is therefore an objective of the invention to provide a dry process for cleaning of precision surfaces using supercritical fluids such as carbon dioxide, alone or in combination with suitable additives such as cosolvents and surfactants. It is a further object to agitate a substrate after suitable exposure to a supercritical fluid or mixture under a higher supercritical pressure, with a rapid decompression of a significant degree. It is a yet further object to combine a rapid decompression step with a full flow supercritical fluid or mixture flush or wash of the substrate, in order to further loosen and evaluate any loose debris, and to further expose the unwanted materials on the substrate to the solvent effects of the process materials. It is another object to illustrate the salient points of an apparatus by which the process may be conducted.

What follows is a preferred embodiment process only, and should not be interpreted as limiting of the invention.

DESCRIPTION OF THE PREFERRED EMBODIMENT

Figure 1:
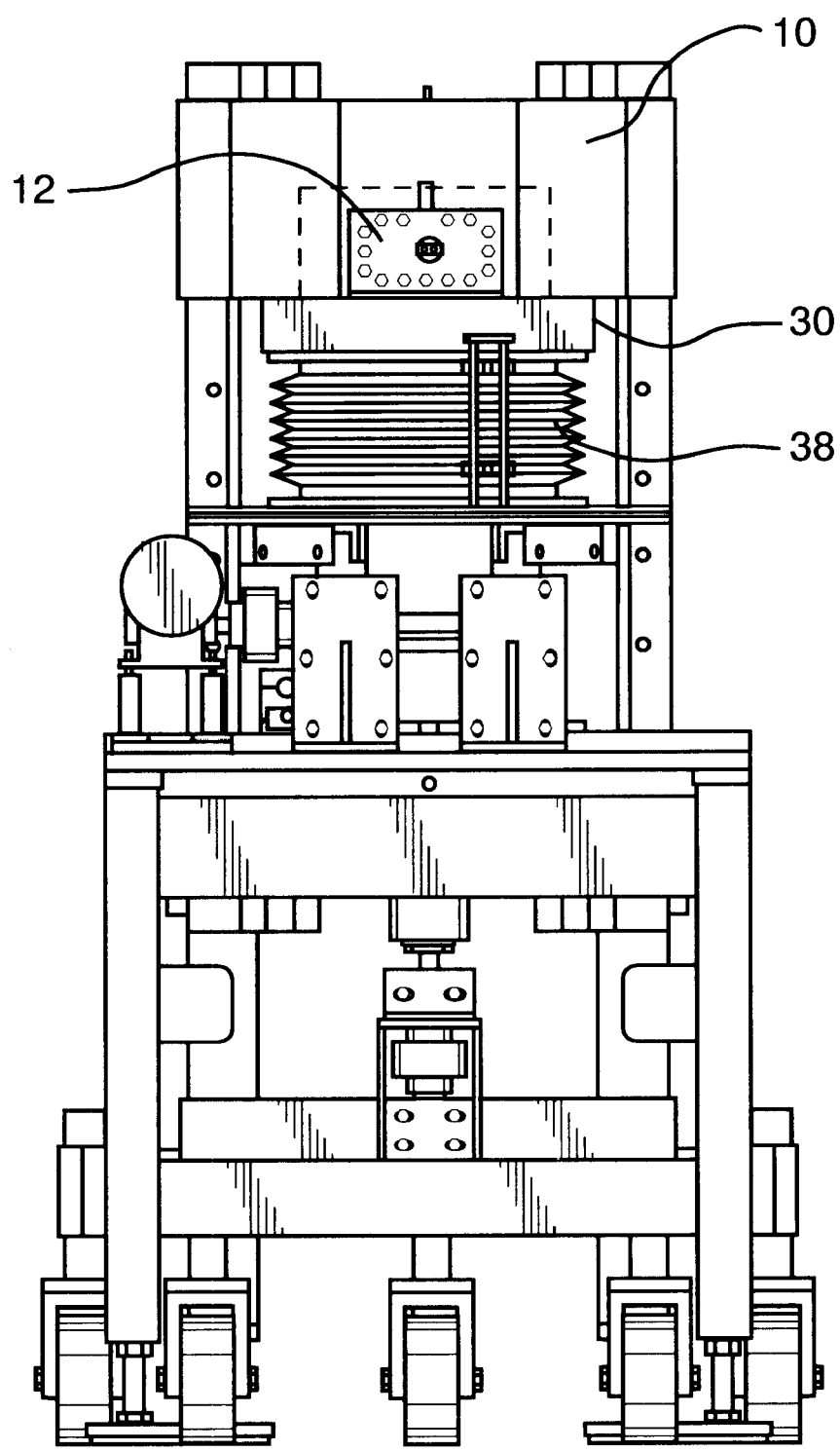
FIG. 1 is a rear elevation of a pressure vessel apparatus with which to carry out the process of the invention, illustrated with the pressure vessel cover in the up and closed position.

A novel process is described for supercritical fluid cleaning of precision surfaces of substrates with or without surface features of organic material such as polymers, which includes layers of this material and related residues from various coating and/or reducing operations conducted upon the surface or its features, and inorganic material, which includes foreign particle matter. In the preferred embodiment that follows, a method for conducting the supercritical fluid stripping of photoresist and the removal of residues from related processing steps from semiconductor wafers will be described. It will be understood by those who are skilled in the art that the cleaning method is not limited to semiconductor wafers but can be applied to other substrates too.

The supercritical fluid cleaning method can be applied at various levels of the semiconductor chip manufacturing, from front end to back end with no limitation to materials or size of the wafer, where the wafer with the photoresist on it undergoes various treatments, such as ion implantation, etching, and other methods that modify the material in the layer below the photoresist, and the photoresist itself.

In the preferred embodiment described below, carbon dioxide, $CO_2$, is the preferred process chemical, but the cleaning method is not limited to $CO_2$. $CO_2$ has been selected because of low values for $T_c$ (31.1° C.) and $p_c$ (1070.4 psi), which represents the most economical set-up in terms of equipment and operating cost, safety and health aspects and environmental issues. The supercritical state of $CO_2$ will be called $SCCO_2$.

The properties of the process substance can be modified by additives, which can be either organic solvents, surfactants, other chemicals like chelating agents or mixtures thereof. Throughout the following description a solvent added to the $CO_2$ is called a "cosolvent", which can consist of more than one chemical to form a binary or a ternary, and so forth, mixture with the $CO_2$. If not otherwise specified, the term "process chemical" denotes $CO_2$ or $CO_2$+ additive as a generic term. Generally an additive is required to reduce the operating pressure of the process chemical in its supercritical state to a minimum. The additive supports the cleaning process by introducing the component of chemical interaction. Additives other than solvents, such as surfactants, can likewise be included in the process described.

Referring again to the manufacturing of semiconductor chips, single wafer processing as opposed to batch processing is the method of choice because of the ever-increasing commercial value of the wafer with size and number of manufacturing steps, and because of quality control requirements. Therefore, in the preferred embodiment of the process equipment, a single wafer is being processed. If tolerated by the nature of the substrate and the specific cleaning requirements, the process equipment can be modified to hold multiple substrates or cassettes of substrates of various sizes, or other suitable equipment utilized.

Referring to FIGS. 1, 2, 3 and 4 showing an apparatus by which the preferred embodiment may be practiced, process chamber 10 consists of a cylindrical cavity with inlet and outlet manifold 12, 14, and lid 30. The process chamber 10 is designed such that an automatic wafer handling system typical to the semiconductor industry can be used to load the wafer into the chamber, but any other wafer loading system including manual loading can be applied too. A master control system for the apparatus shown and the associated fluid supply and recovery system is assumed. In most cases, pressure vessel process control will be further integrated into the control system of the wafer processing system with which the pressure vessel is associated.

Figure 2:
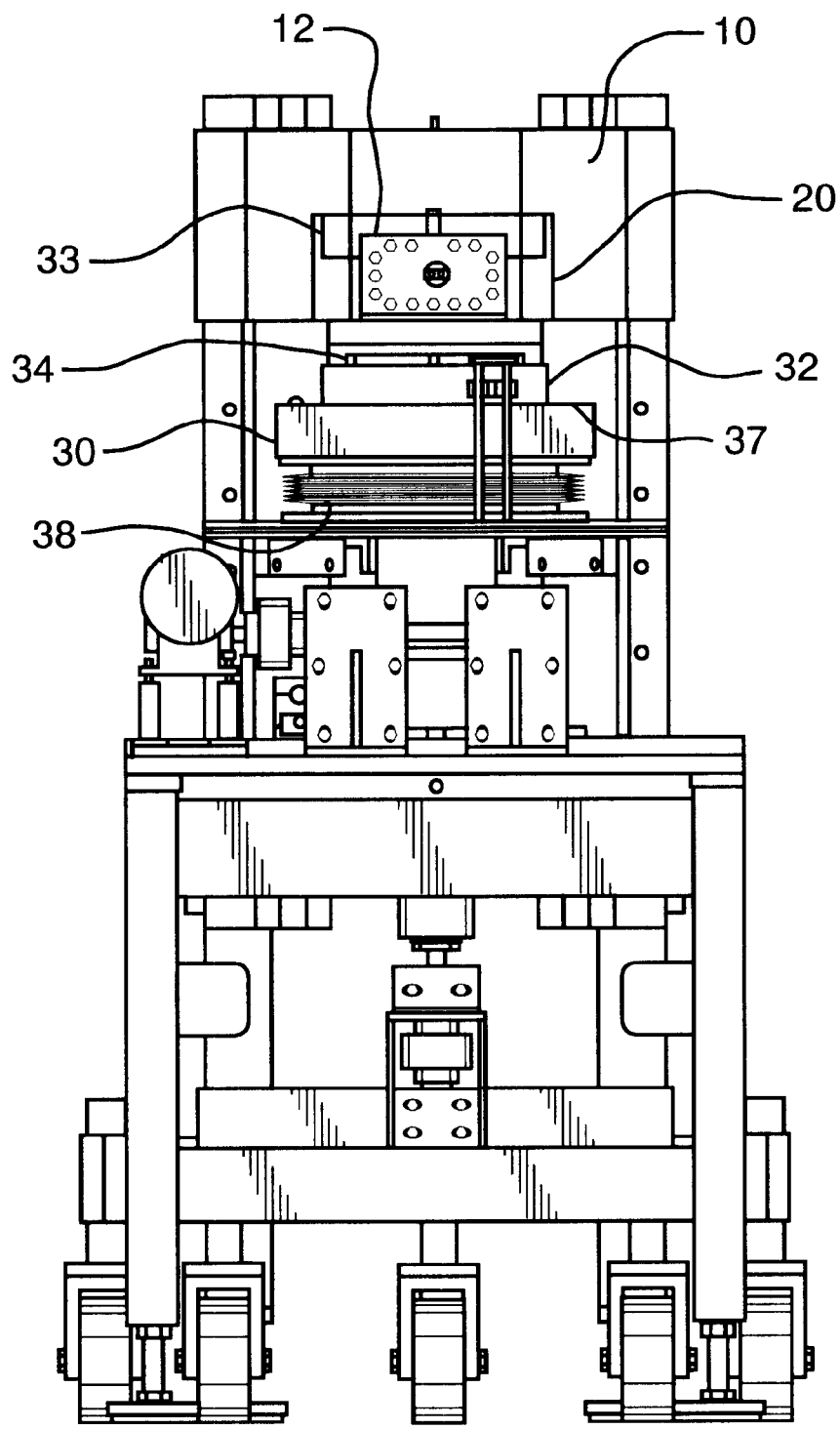
FIG. 2 is a rear elevation of the apparatus of FIG. 1, with the pressure vessel cover in the down and open position, exposing the wafer.

The process chamber 10 is located above the wafer plane in the open cover position (FIG. 2). The process chamber does not move nor does it have any moving parts. To close the process chamber, the lid 30 carrying an elastomeric type of seal 37 is moved up linearly towards the seal seat. Upon locking, the seal undergoes compression by axial forces only, from beneath the lid. This minimizes greatly the generation of particulates in the proximity of the pressure chamber. Furthermore, the seal of the lid is located below the wafer plane further eliminating the risk of adding particulates to the wafer upon closing and locking. The locking mechanism is sealed from the process chamber by a bellows 38. There are no moving parts of the apparatus exposed below, in or above the plane of the wafer other than the lid and bellows, during the opening, closing and locking procedures. Suitable locking mechanisms are described in the priority documents cited above.

Figure 4:
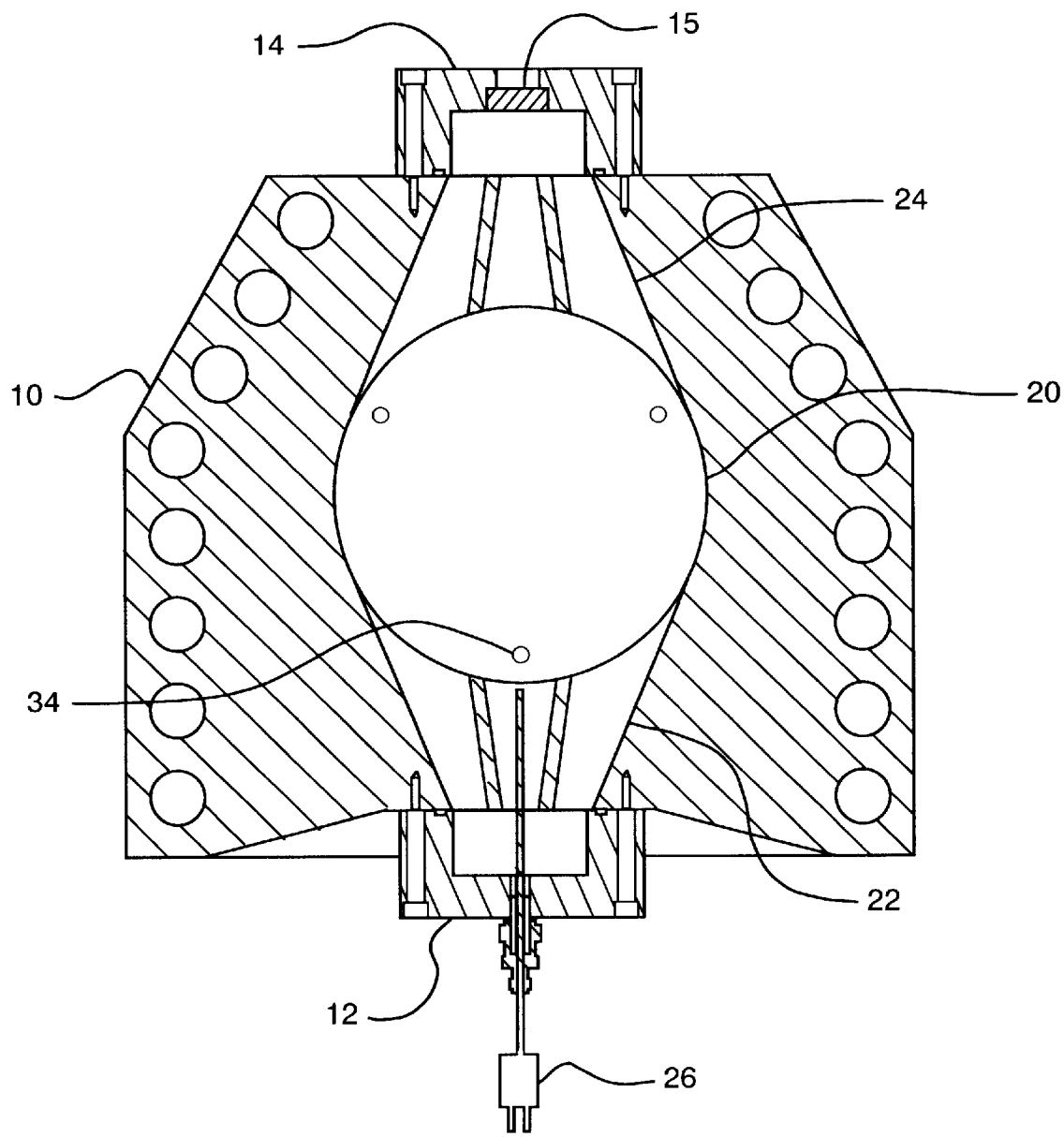
FIG. 4 is a horizontal cross section view of the apparatus of FIG. 1, revealing the process chamber with divergent and convergent fluid flow channels.

Referring to FIG. 4, the process chemical enters the process chamber 10 through a first manifold block 12 and is directed through a divergent flow path 22 into the chamber cavity 20. On the opposite side of the chamber a convergent flow path 24 directs the $CO_2$ out and into a second manifold block 14. The geometries of the flow paths and process chamber provide a well distributed flow pattern through the chamber insuring that the full surface area of the wafer is exposed to flow. For a design maximum flow rate of 8 lb/min of process chemical for the preferred embodiment apparatus, the internal height and volume of the chamber cavity has been chosen to prevent the flow from choking.

Referring again to FIG. 4, the manifold blocks 12 and 14 serve multiple functions. $CO_2$ supply lines for process chamber inlet 11 and outlet 13 are connected with the manifold blocks. In addition, one block holds a thermocouple 26 to measure the temperature in the chamber close to the wafer. The other one has a window 15 to optically monitor the wafer during the process. The symmetry of the internal chamber design permits fluid flow in either direction, with suitable line switching capability, so that the process effects can be applied singularly or alternately from either direction across the wafer under process.

Figure 3:
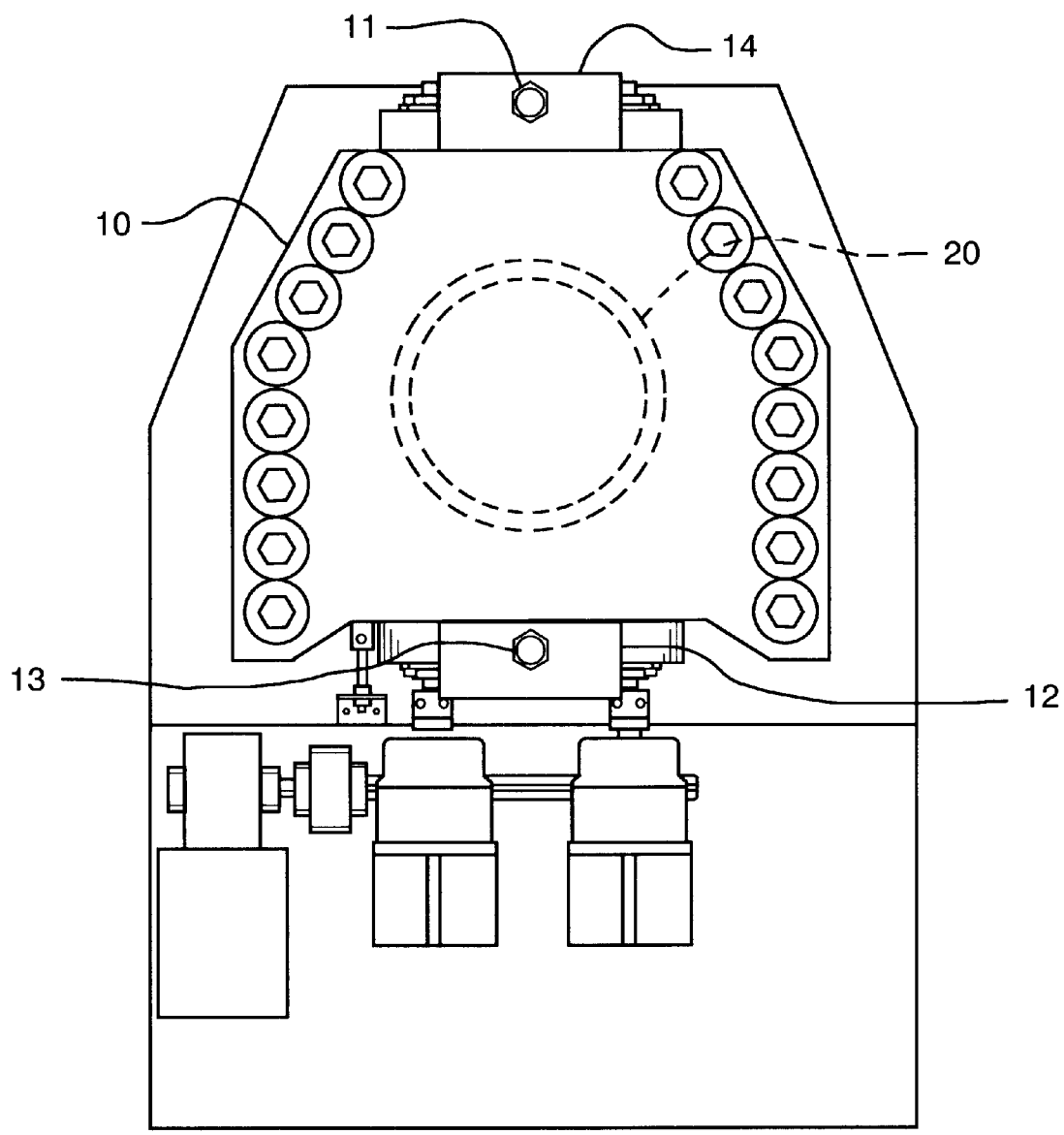
FIG. 3 is a top plan view of the pressure vessel apparatus of FIG. 1, the dotted line circles representing the pressure chamber and wafer in process.

The chamber can be closed off with shut-off valves 52, 54 (FIG. 6) at inlet 13 and outlet 11 (FIG. 3). A soak step will be realized this way. Inlet and outlet valves can be individually opened or closed by the master control system.

Figure 5:
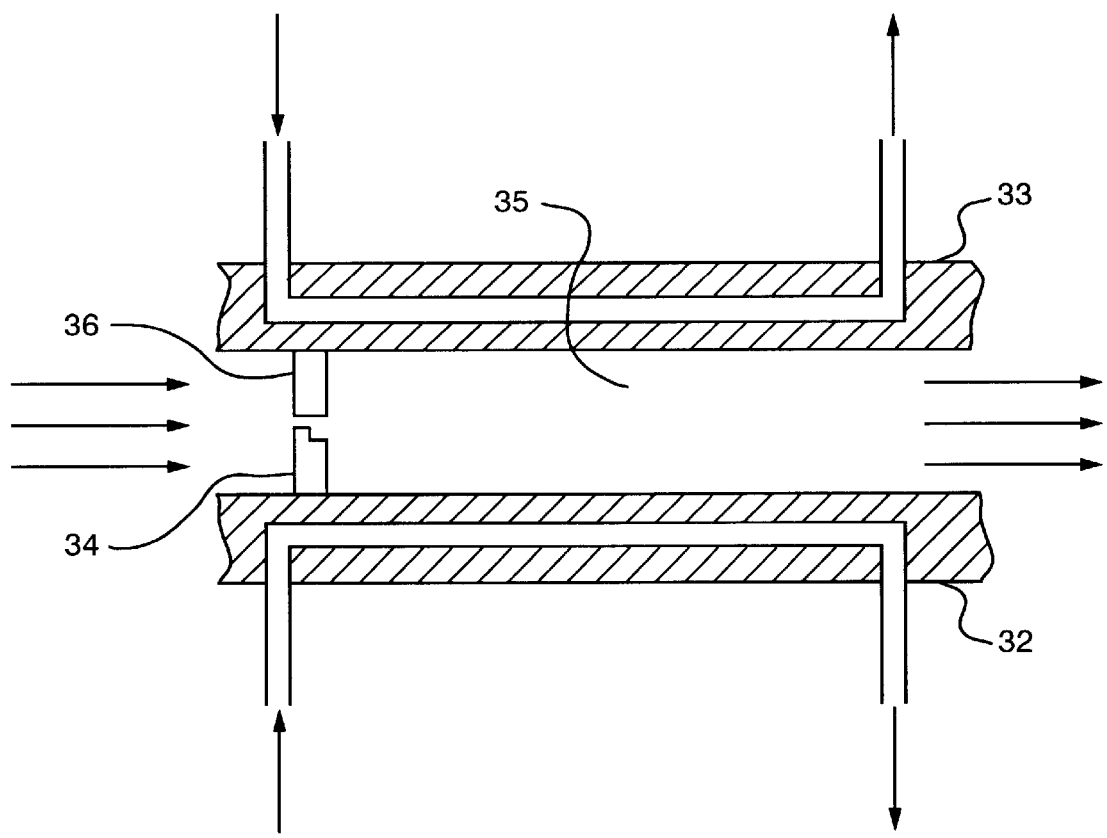
FIG. 5 is a diagrammatic partial cross section elevation view through the pressure chamber of the apparatus of FIG. 1, illustrating the upper and lower heating and cooling platens, and the fluid flow through the chamber.

Referring to FIG. 2 and 5, the process chamber 10 is equipped with heater platens 32 and 33 that provide for controlling the temperature in the process chamber. The outer diameter of the platens is slightly smaller than the inner diameter of the process chamber so that the platens can be replaced if needed. The lower platen 32 is mounted to the chamber lid 30. Wafer mounting studs 34 are mounted on platen 32. The upper platen 33 is mounted to the ceiling of the chamber cavity 20. The platens can be heated and cooled simultaneously or set to different temperatures. The wafer is located between the platens, preferably in the middle between the platens (FIG. 5) when the chamber is closed.

In the preferred embodiment the maximum pressure cavity temperature is 150° C. Therefore the wafer will never be heated to a temperature above 150° C., which is beneficial for semiconductor wafer manufacturing in so far as this process does not add to the thermal budget of the wafer. Changing the temperature of the platens is achieved by changing the temperature of the heating/cooling medium (FIG. 5). In one embodiment, the heating/cooling loop consists of a heater set to a desired high temperature (<150° C.) and a chiller set to a desired low temperature (>25° C.). Applying heating/cooling medium from the respective reservoir simply changes the temperature in the process cavity from hot to cold or vice versa quickly. With this method, a temperature change of the platens 32 and 33, of from 25° C. to 150° C. can be performed in about one (1) minute. Using the platens to control the process temperature in the chamber rather than heating the whole chamber mass provides a means of quickly changing phases of the process chemical during the process. Therefore, the described heating/cooling platens enable better control of an additional process variable, the process temperature T, in addition to the pressure p. Varying the process temperature of both platens simultaneously allows switching between supercritical and liquid states while holding the pressure $p > p_c$. Setting the platens to different temperatures can be done to generate convective currents in the process fluid.

Referring to FIG. 5, the wafer is normally loaded and rests face up horizontally on three studs 34 mounted to the lower platen 32. Subject to configuring the transport and loading mechanism appropriately, the wafer can be loaded and processed face down, providing a gravitational component to the cleaning process for preventing loose particulate matter from contacting or re-depositing on the critical surface.

The studs, separated by 120° (see also FIG. 4), feature edge restraints such that the wafer cannot skid off of them in the horizontal plane by the drag of the process chemical while it flows through the process chamber. In order to prevent vertical lifting of the wafer the studs have counter parts 36 mounted to the upper platen 33 at exact the same positions as the lower studs. When the chamber is closed upper and lower studs build a vertically oriented rod with a slit to hold the wafer. The midlevel holding arrangement of studs 34 and 36 provide effective cleaning of both sides of the wafer.

As described above, pressure p [psi] and temperature T [° C.] are process parameters and are most usefully measured in the chamber of this apparatus. Other process parameters are flow rate $\dot{m}$ [lb/min] $\dot{V}$ [cm$^3$/min], amount of additive n [mol %] or [cm$^3$/min], and time t [sec]. The process as described below is performed between two sets of parameters, with the index "0" denoting high values, for example $p_0$=3,500 psi and $T_0$=150° C. for the preferred embodiment, and the index "1" denoting low values, for example $p_1$=1500 psi and $T_1$=100° C. The temperature and the lower pressure are selected such that the process chemical is kept at supercritical state at all times. The higher pressure is selected to provide a higher solubility of polymer components in $CO_2$ and a maximum pressure differential during decompression, within the safe limits of the mechanical system. The pressure ratio being preferably at least 2:1.

Figure 6:
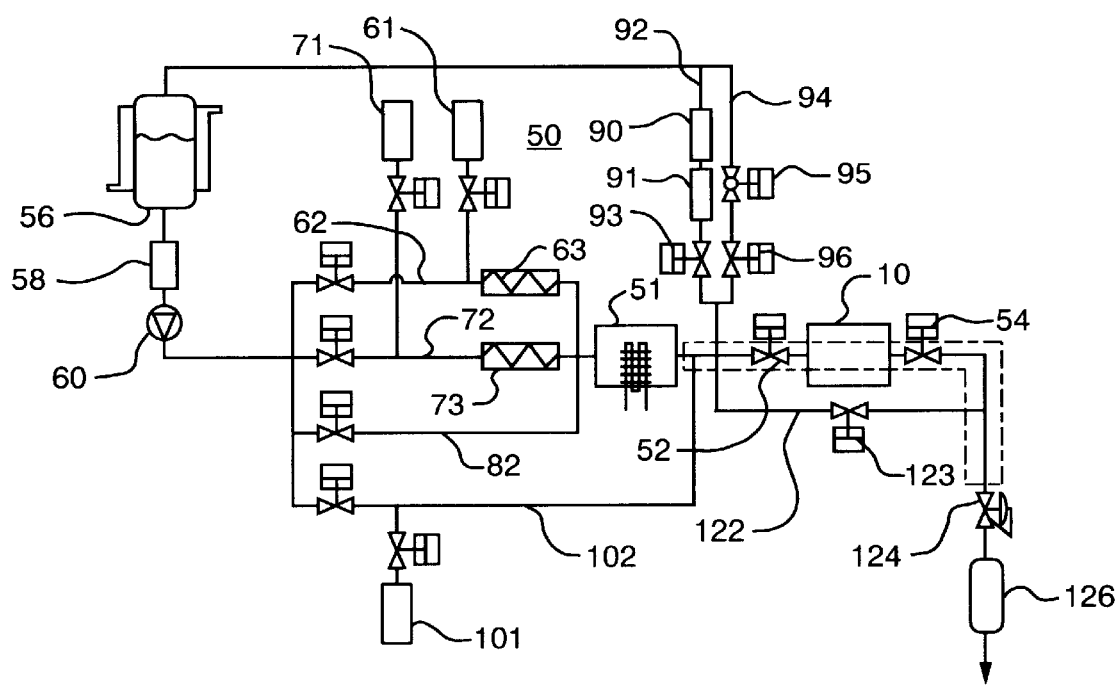
FIG. 6 is a simplified schematic of the process fluid supply and recovery system supporting the pressure vessel apparatus of FIG. 1, also relating to FIGS. 9 and 10.
Figure 10:
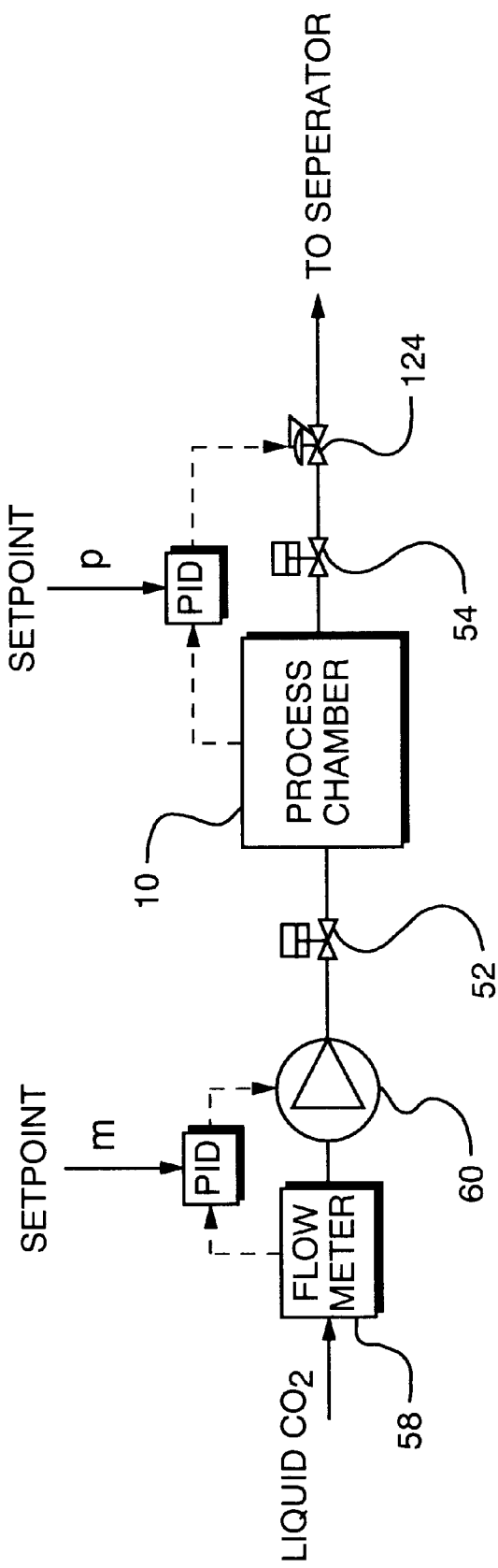
FIG. 10 is a simplified schematic of the principle apparatus components of the process fluid supply system affecting the process parameters within the process chamber, as related to FIGS. 6 and 9.

Referring to FIGS. 6 and 10, the process chemical can be supplied by the supply system in 6 variations: (i) gaseous $CO_2$, (ii) supercritical $CO_2$, (iii) supercritical $CO_2$+ cosolvent, (iv) supercritical $CO_2$+surfactant, (v) liquid $CO_2$, (vi) liquid $CO_2$+surfactant. Referring to FIG. 6, the supply system 50 includes a storage tank 56, which is part of the $CO_2$ delivery system 50, containing high purity $CO_2$, a flow meter 58, a liquid $CO_2$ pump 60, three supercritical lines 62, 72, 82, two gas lines 94 and 92, and one liquid line 102. All lines merge into one single line, which is the inlet 13 of the process chamber 10.

The pressure in the system and specifically in the process chamber is built up by a backpressure regulator 124 that is part of the outlet line of the process chamber. The process chemical expands behind the backpressure regulator into a separator tank 126 such that the $CO_2$ evaporates and the additive is collected. The separator is designed to avoid dry ice formation and plugging of lines. Inlet and outlet lines of the process chamber are equipped with shut-off valves 52 and 54, located close to the process chamber. In order to deliver a constant flow of $CO_2$ it is desired that the $CO_2$ supply in the storage tank 56 be kept at constant pressure. The preferred pressure is 800 psi and is maintained by control of temperature. The desired temperature is close to 20° C. at which the $CO_2$ has a vapor pressure of 800 psi. Any other temperature and pressure setting below the critical point can be chosen.

In order to maintain the integrity of the phases of the process chemical, inlet and outlet lines of the process chamber 10, and valves 52, 54 are heated to the desired process temperature as indicated by the dotted lines in FIG. 6.

The $CO_2$ delivery system 50 allows charging the process chamber 10 with either the process chemical in the gas, the liquid or the supercritical state. Pressurizing the process chamber with supercritical process chemical is desired for some processes such as dry resist develop. Using supercritical process chemical instead of liquid one prevents pattern collapse of high aspect ratio structures, as noted in *Environmental News*, Vol. 35, Issue 7, pp. 140A–141A, which is incorporated herein by reference.

Figure 7:
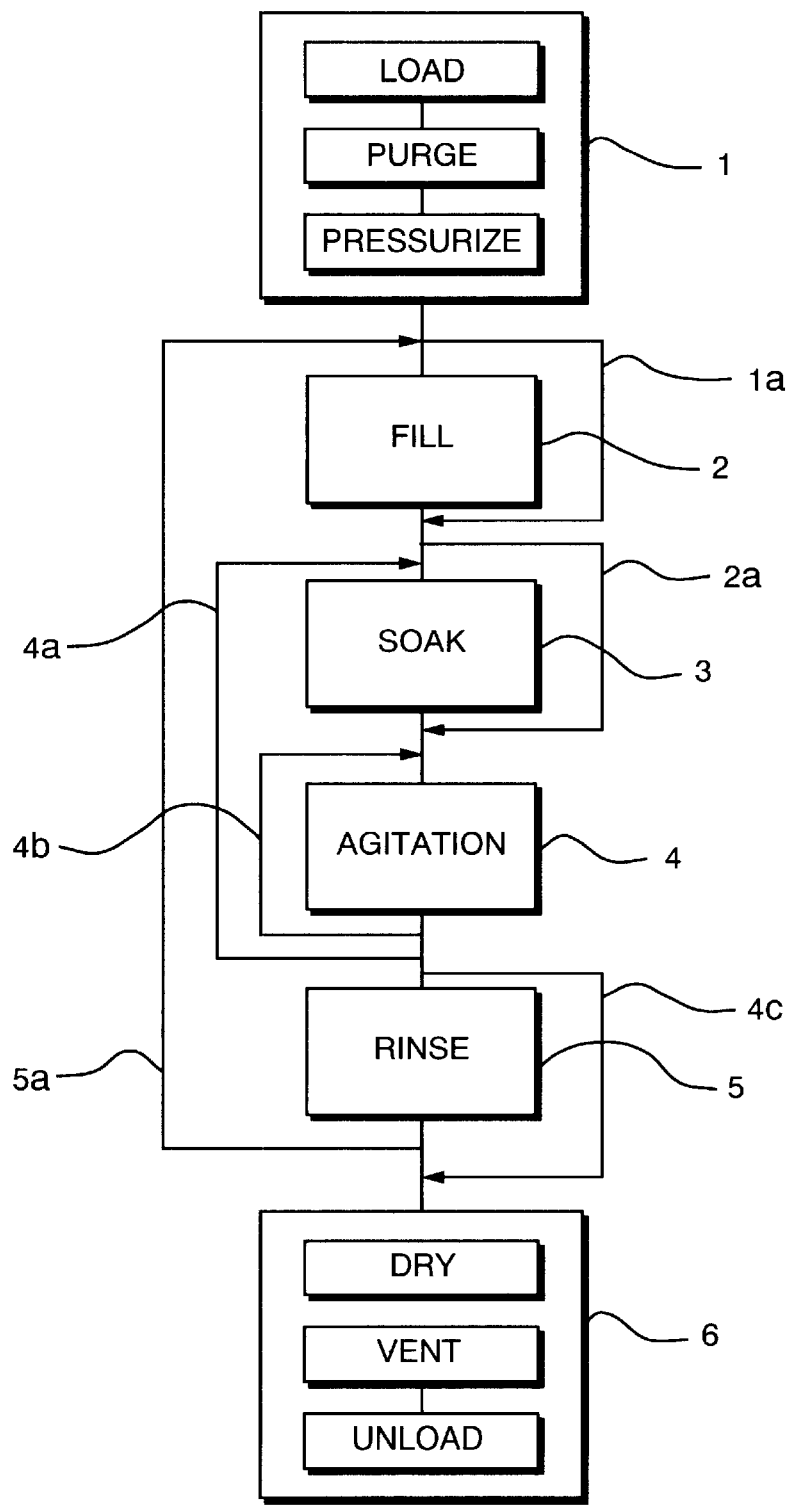
FIG. 7 is a flow chart of the process steps of the invention, illustrating the preferred and alternative preferred embodiments of the process sequence.

Referring to FIG. 7, the preferred embodiment cleaning method consists of 6 basic process steps:

1. Load, purge, pressurize chamber
2. Fill chamber with process chemical;
3. Soak with process chemical;
4. Provide agitation;
5. Rinse;
6. Dry, vent, unload chamber Process steps 1 and 6 are necessary pre and post process steps to the core steps of the process; fill, soak, agitate, and rinse. These principle process steps 2 through 5, or alternatively, steps 3 and 4 or step 4, within the sequence of steps 2 to 5, can be repeated as many times as needed in a process cycle to satisfy the user's requirement. It will be readily apparent to those skilled in the art that the soak and agitation steps are fundamental to the cleaning process of the invention, and that repetition of these two steps or of other combinations of the basis process steps will provide additional cleaning effect to the wafer under process. In other variations on the process cycle, steps 3 and/or 5 may be skipped in one or more iterations of the sequence of a full process cycle. Process parameters can be modified between or during a process cycle, and the process chemicals can be varied if required, as well. In its entirety, the 6 process steps of the invention describe a "one step" dry-to-dry process that combines photoresist stripping, residue removal, and drying.

The basic process steps are described in detail, in the context of the enabling apparatus illustrated in the figures, as follows:

1. Load, Purge, and Pressurize

Once the wafer is positioned on studs 34 as described above, lid 30 moves in a linear motion towards the process chamber 10. While the lid is moving, gaseous $CO_2$ flows through a dedicated line 92 into the process chamber with the outlet valve 54 closed. When lid 30 (FIG. 2) approaches its final position 30 (FIG. 1), the gap between the seal and the seal seat is getting smaller. Gaseous $CO_2$ is now leaving the process chamber through this gap generating a forced flow of $CO_2$ gas from the inside towards the outside of the chamber through the gap. The flow of $CO_2$ gas into the process chamber is adjustable but kept constant by means of a mass flow controller 91. Therefore, with the decreasing gap between seal and seal seat, the $CO_2$ flow through the gap from the inside of the process chamber to the outside is increasing in velocity. The outflow velocity reaches its maximum in the moment just before the lid is locked to close the chamber, i.e. when the gap is reduced to a minimum. This gaseous $CO_2$ flow carries any particulates that may be generated when the seal touches its seat away from the wafer and the chamber. The wafer is thus prevented from being contaminated by particulates of this source.

Once the chamber is closed and locked, the $CO_2$ continues to flow, which results in an increase in pressure in the process chamber. The gaseous $CO_2$ pressure is a variable but typically limited to 28 psi by a pressure regulator 90. The outlet valve 54 of the chamber as well as valve 128 and backpressure regulator 124 will be opened and the chamber will be purged with a continuous flow of gaseous $CO_2$ to replace the air that is trapped in it. The process control parameter is the purge time. Pressure and flow rates of gaseous $CO_2$ are preset.

Prior to pressurization of the chamber, the gas supply system is conditioned such that all supply lines 62, 72, 82 are filled with $CO_2$ and are set to a pressure of 800 psi up to the inlet valve of the process chamber. The temperature of the system, which includes the heater platens 32 and 33 in the process chamber, will be set to the desired operating temperature $T_0$ with $T_0 > T_c$, and the outlet valve 54 of the process chamber is closed. The process chamber is then charged with gaseous $CO_2$ through another dedicated line 94 out of the $CO_2$ storage tank 56 and pressurized to a pressure of 800 psi, which is the equilibrium pressure of the $CO_2$ vapor in the storage tank.

Although one line for gaseous $CO_2$ would be sufficient to supply gaseous $CO_2$ to the process chamber, the preferred embodiment apparatus provides two lines, one, 92, for purge, and another, 94, for pressurization. The second gaseous $CO_2$ line is directly connected with the $CO_2$ storage tank and has a valve arrangement for shut-off, 96, and variable flow, 95. With increasing pressure in the process chamber, the flow through this line is being increased continuously to minimize the time to pressurize till finally the line connecting the storage tank and the process chamber is completely open with the pressure in the process chamber being at 800 psi or at the same pressure as the $CO_2$ vapor in the storage tank 56. The gaseous supply line is then closed.

In the preferred pressurization procedure, the pressure chamber 10 is being pressurized with $CO_2$ in gas and supercritical phase, avoiding the liquid phase. To achieve this, lines 62, 72, and 102 are closed. Line 82 and inlet valve 52 will be opened once the pressures on both sides of the inlet valve 52 are equal and at 800 psi. Inlet valve 54 is then opened and the $CO_2$ pump 60 delivers liquid $CO_2$ into line 82. At the initial pressure of 800 psi the $CO_2$ is transferred into its gas state on its way through the heater 51 as indicated by the arrow in FIG. 8. Upon material transport into the pressure chamber its pressure will be increasing. Since the temperature in the heated supply line and in the process chamber is at $T_0 > T_c$, the $CO_2$ in the process chamber initially remains a gas. Once the pressure has increased to a pressure $p > p_c$, the $CO_2$ in the chamber is transferred into its supercritical state. The pressurization sequence ends once pressure $p_0$ is reached. The process chamber is now charged with supercritical $CO_2$ with the $CO_2$ in its supercritical state. The time budget for this step of the preferred embodiment method is 70 seconds, although longer or shorter times may be appropriate, depending on the wafers to be cleaned, the selected process fluids and parameters, and various equipment limitations.

2. Fill Chamber with Process Chemical

During the pressurization procedure the backpressure valve 124 is preset to the desired operating pressure $p_0$. Once the pressure in the pressure chamber has reached $p_0$, the outlet valve 54 is opened and the supercritical $CO_2$ flows continuously through the pressure chamber at the desired operating pressure $p_0$, temperature $T_0$, and constant flow $\dot{m}_0$ monitored by the flow meter 58. To prepare for the fill step, line 82 is closed and line 62 is opened simultaneously with the $CO_2$ now flowing through the cosolvent line. Referring to FIG. 10, flow of process chemical is maintained constant by a PID loop connecting flow meter 58 and pump 60. The pressure is controlled by a PID loop comprising back pressure regulator and pressure transducer reading the pressure in the process chamber.

With the $CO_2$ flow $\dot{m}_0$ known, the cosolvent metering pump 61 is set to deliver an amount n in $cm^3/min$ of cosolvent into the flow of $CO_2$ to achieve a concentration of preferably 2 to 8 vol %. The mixture of $CO_2$ and cosolvent, called the process chemical, is transformed into its supercritical state while passing through heater 51. It enters the process chamber through heated lines, which maintain the supercritical state during flow. The critical point of the binary process chemical shifts towards higher values as compared to pure $CO_2$. The concentration of the cosolvent in $CO_2$ is chosen such that at $p_1 = 1500$ psi and $T_1 = 100°$ C. in the process chamber 10, the cosolvent does not precipitate out of solution. At a flow rate of 3 liters/min of liquid $CO_2$ the supercritical $CO_2$ of the process chamber from the previous pressurization step can be replaced in less than 10 seconds, however the preferred embodiment method budgets 40 seconds for this step.

3. Soak

Figure 9:
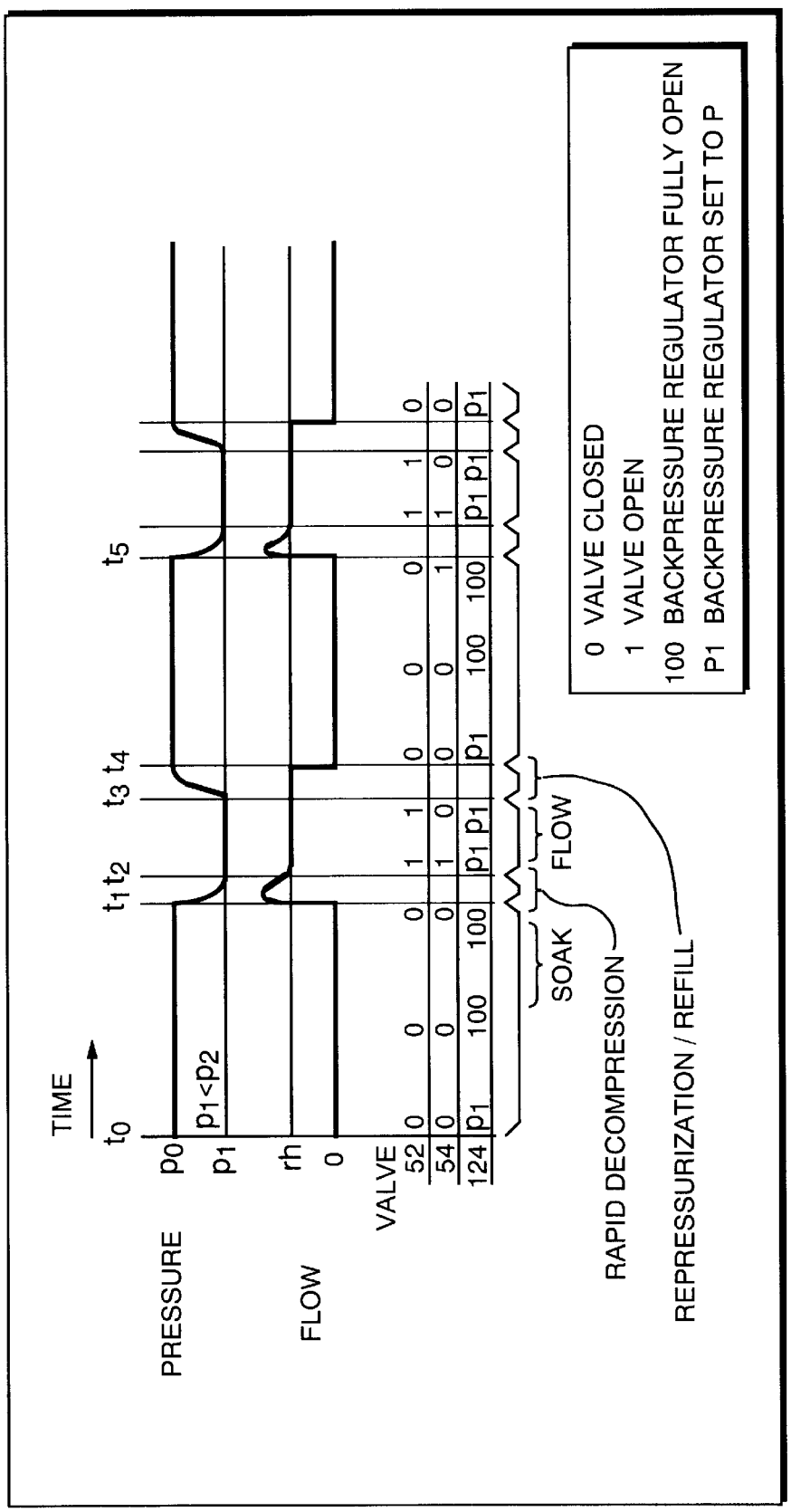
FIG. 9 is a time line chart of pressure and flow in the pressure vessel of the apparatus of FIG. 1, also relating to FIGS. 6 and 10, during a sequence of twice repeated soak and agitate steps of the invention process, illustrating the rapid decompression and full flow parameters to which the wafer under process is subjected.

Referring to FIGS. 6 and 9, there is shown a chart for process and flow as a function of time for repetitive soak and agitation steps 3 and 4. These steps can be run once in a process cycle, or with any number of repetitions, in accordance with the user's requirement. Once the chamber is filled with process chemical during the preceding Fill step, inlet valve 52 and outlet valve 54 are closed at soak start time $t_0$. The process chemical in the process chamber remains at the temperature $T_0$ and pressure $p_0$. Sometime during the soak step backpressure regulator 124 is reset to full open. During the soak period, the infusion of $CO_2$ and cosolvent at high pressure into the photoresist and sidewall polymer material causes swelling. It is assumed that during this swelling process mechanical stress occurs at the interface of the photoresist and polymer material to the substrate, tending to stress, weaken, and rupture the interface bond at a microscopic level. As explained above, sidewall polymers typically are fluorinated compounds that dissolve in $CO_2$. The cosolvent aids during the soak step to weaken and break chemical bonds within the polymer layers of the bulk photoresist reducing its average molecular weight. The soak step is static with no flow. The time budget for the soak step for the preferred embodiment process is 30 seconds, although longer or shorter times may be desirable depending on all other variables as described above.

4. Agitation

Referring to FIGS. 6, 9, and 10, by completion of the soak step at $t_1$, outlet valve 54 is opened to apply rapid decompression to the chamber; backpressure regulator 124 having been previously set to full open so as to make the decompression as rapid as the conductance of valve 54 and the lines permit. By application of the rapid decompression step at $t_1$, the photoresist and sidewall polymer material, having been previously infused with $CO_2$ and cosolvent under the higher pressure $p_0$ during the soak step, is now subjected to a dramatic stress of internal to external pressure differential, inducing a mechanical rendering, breaking up and loosening of the structure of the photoresist and the sidewall polymer as the $CO_2$ and cosolvent is evacuated.

Experiments have been carried out to investigate the absorption of $CO_2$ in polymeric material and its behavior upon decompression. It has been found that when rapidly decompressed significant structural changes of the polymeric material can be induced; ref. *Evaluation of Supercritical Fluid Interactions with Polymeric Materials*, Samuel P. Sawan, et al., in "Supercritical Fluid Cleaning—Fundamentals, Technology and Applications", John McHardy, Samuel P. Sawan, ed., Noyes Publications, Westwood, N.J., USA, 1998, pp. 130, incorporated herein by reference. In the preferred embodiment process here, the pressure vessel is maintained at the lower pressure $p_1$ for a sufficient period of time to dissipate the pressure differential affecting the photoresist and the sidewall material.

Initializing the rapid decompression is accompanied by an initial surge of outflow of process fluid. At time $t_2$ shortly thereafter, inlet valve 52 is opened to introduce an inflow at $p_1$ that will sustain the rate of outflow, thus providing a full flow washing action through the process chamber over the wafer to lift and flush the loosened and loosening material during the decompressive rendering. The inflow mixture can be altered during this decompressive flush, if desired, for the repetitive soak and agitation sub cycle that is illustrated here.

Referring to FIG. 6, during the fill stage the supply side was increased to $p_0$. Since during rapid decompression pressure drops to $p_1$, feed line 62 has to be prepared to start delivery at $p_1$ for the agitation step that follows. Therefore during soak with inlet valve 52 and outlet valve 54 closed, line 62 is bled to $p_1$ through the bypass line 122 and valve 123 with backpressure valve 124 set to $p_1$. Once $p_1$ is reached, valve 123 closes and backpressure valve 124 is set to full open. The agitation step starts at $t_1$ as outlet valve 54 is opened and the pressure in the process chamber drops quickly towards $p_1$. At $t_2$ when the pressure vessel has bled down to $p_1$ inlet valve 52 is opened and supercritical $CO_2$ at flow rate $\dot{m}_0$ is delivered through line 62 into the process chamber to sustain the rate of outflow. Once the pressure is dropped to $p_1$, backpressure valve 124 is set to $p_1$ and the flow continues through the process chamber at the lower pressure. The composition of the process chemical can be altered if required at any time before or during this flow by opening alternative feed lines 72 or 82 as desired.

If the soak and agitation steps are to be repeated, then at $t_3$ outlet valve 54 is closed causing the pressure in the process chamber to rise till $p_0$ is reached at $t_4$, the end of the agitation step, at which time inlet valve 52 is shut off to terminate the flow and to reset the clock to $t_0$ for the next soak step.

The time budget for the agitation step for the preferred embodiment method is 20 seconds, but again, the time is variable depending on all other variables and the user's requirement.

5. Rinse

If the process cycle is to be taken to completion at this point, then at $t_3$ outlet valve 54 is closed causing the pressure in the process chamber to rise till $p_0$ is reached at $t_4$, beginning the rinse step at full pressure and full flow.

Rinsing can be performed either in the liquid or the supercritical state with pure $CO_2$ or $CO_2$+additive, e.g. surfactant. If a rinse in the liquid state of $CO_2$ is to be performed, the temperature in the process chamber and inlet and outlet lines have to be dropped below $T_c$. Rinsing is then performed by pumping liquid $CO_2$ or liquid $CO_2$ mixture through line 102. The pressure in the pressure chamber is maintained at $p>p_c$. The preferred embodiment method time budget for this step is 30 seconds, subject to the same variables as other steps.

6. Dry, Vent, Unload

Figure 8:
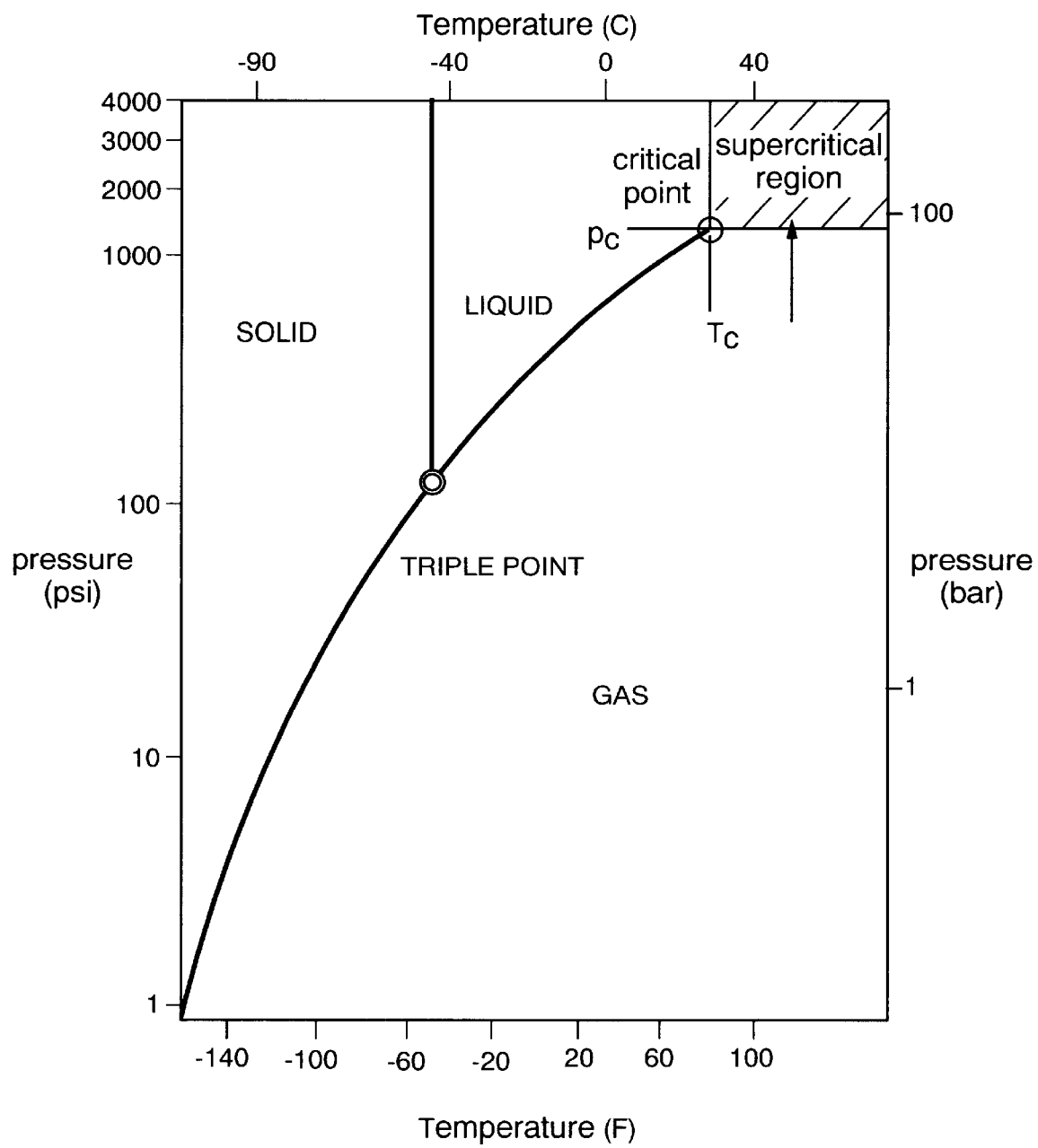
FIG. 8 is a phase diagram illustrating the temperature/pressure relationship to the phase or state and the critical pressure/temperature point of the preferred embodiment process fluid, carbon dioxide.

Drying is performed by venting the chamber to atmosphere pressure using backpressure valve 124 as a variable orifice to control the pressure decrease. Referring to FIG. 8 the pressure in the process chamber is forced to decrease along a vertical line with $T>T_c$ and $T=\text{const}$. This technique transforms supercritical $CO_2$ directly into the gas state without crossing the liquid-gas boundary. Residual stains due to liquid droplet formation are prevented.

If during the rinse step $CO_2$ is used in its liquid state with the pressure $p>p_c$, inlet valve 52 and outlet valve 54 are closed and the temperature in the process chamber is increased to bringing the $CO_2$ into the supercritical state. If during the rinse step the pressure was allowed to go below $p_c$ the pressure is first increased to above $p_c$ before the temperature is increased, in order to insure that during temperature increase the liquid-gas boundary is not crossed accidentally. Once the pressure chamber has been vented to atmosphere pressure, gaseous $CO_2$ is applied as during the opening procedure for the same reason as in the closing procedure. Unloading and reloading for the next process cycle is then initiated.

The time budget for this step of the preferred embodiment method, ending when the wafer is unloaded, is 45 seconds, but is again subject to the same variables as in other steps.

The invention is susceptible of other embodiments. For example, there is a supercritical fluid cleaning process for cleaning precision surfaces on substrates such as semiconductor wafers, consisting of the steps of:

(a) Selecting process materials consisting of a process gas which is convertible at a critical point of temperature and pressure to a supercritical fluid for cleaning.

(b) Selecting supercritical fluid operating parameters for the process gas including a supercritical temperature, a lower supercritical pressure, and a higher supercritical pressure, with the higher supercritical pressure being preferably at least twice the lower supercritical pressure.

(c) Loading, closing and sealing at least one substrate with a precision surface in a pressure vessel, where the vessel is connected to a source of process gas and a source of supercritical fluid and has at least one port for exhausting byproducts of said process. The vessel is also configured with heat exchanger platens or the like for heating the interior of the vessel. And the vessel has independent means such as inlet and outlet valves for isolating the vessel from inflow of the process materials and outflow of the process byproducts.

(d) Purging and pressurizing the vessel with process gas and supercritical fluid to the higher supercritical pressure while heating the interior to the supercritical temperature so as to displace all other gases with supercritical fluid without entering a liquid phase condition.

(e) Soaking the substrate at the higher supercritical pressure for a predetermined soak period, so as to infuse the materials to be removed with the supercritical fluid mixture under the higher supercritical pressure.

(f) Agitating the substrate by rapidly decompressing the vessel to the lower supercritical pressure so as to mechanically stress the material to be removed with the pressure differential, while flushing the vessel and the substrate with supercritical fluid for a predetermined period of time to wash out the loosened debris and particulate matter, and then rapidly elevating the vessel pressure back to the higher supercritical pressure to further stress the remaining materials to be removed.

(g) Rinsing the substrate at the higher supercritical pressure.

(h) Drying the substrate with supercritical fluid and process gas by maintaining the vessel at supercritical temperature while decreasing vessel pressure to ambient. And then, (i) Opening the vessel and unloading the substrate.

The vessel in this embodiment may also be connected to a source of supercritical fluid mixture consisting of the supercritical fluid and selected additives in solution, where the process includes a further step (d.1) of filling the vessel with the supercritical fluid mixture so as to replace the supercritical fluid, and consequently in step (f), flushing the supercritical fluid mixture with either supercritical fluid, or fluid with such additives as desired, to be then followed by another iteration of agitation, soak and agitation, or by advancing to the rinse step. The core process steps of filling through agitating may be repeated one or more times in a given process cycle. The preferred process gas is carbon dioxide, but other process gases may be used.

In accordance with the goal of automating the process, the process is expected to be conducted in repetitive cycles with a processed substrate being unloaded and a new substrate being loaded in a shared step between consecutive cycles. Also, the vessel may be configured as an inverted vessel with an underside vertically operated lid upon which the substrate is loaded for processing. Other embodiments may accommodate multiple substrates in stacks, arrayed in a common plane, or otherwise oriented to fit in the vessel and be effectively cleaned by process mechanisms.

The vessel heaters may be one or more heat exchanger platens in the vessel, preferably two platens between which the substrate is secured for processing. While the substrate may be processed with the precision side up, the process may be conducted with double sided substrates or with the precision side down. The vessel may have a divergent inflow channel and a convergent outflow channel to facilitate an effective flow pattern across and around the substrate. Further, the vessel and fluid supply and recovery system may be configured for reversing the direction of flow of the process materials through the vessel, even during the process cycle if bi-directional flow action across the substrate is desired for more effective cleaning.

The vessel may also be connected to a source of a process gas mixture of process gas and selected additives, for which the process can incorporate additional or alternate steps to employ in the process, as by varying pressure between supercritical and gas states while holding temperature at supercritical level so as to avoid entering a liquid state condition. Likewise, the vessel may be connected to a source of process gas in liquid state, for circumstances when having a liquid contact the substrate is useful.

As another example of the invention, there is a supercritical fluid cleaning process for cleaning precision surfaces consisting of the steps:

(a) Selecting process materials comprising carbon dioxide as a process gas which is convertible at a critical point of temperature and pressure to a supercritical fluid for the cleaning process, and additives soluble in the process gas.

(b) Selecting supercritical fluid operating parameters for the process gas including a supercritical temperature, a lower supercritical pressure, and a higher supercritical pressure, where the higher supercritical pressure is preferably at least twice the lower supercritical pressure, although a lesser differential may provide a sufficient benefit under some circumstances.

(c) Loading, closing and sealing at least one substrate with a precision surface in a pressure vessel, where the vessel is connected to a source of process gas, a source of supercritical fluid, and a source of supercritical fluid mixture consisting of supercritical fluid and additives. The vessel has at least one port for exhausting byproducts of the process, and is configured with upper and lower heat exchanger platens for heating the interior. It has independent means for isolating the interior from inflow of process materials and outflow of byproducts.

(d) Purging and pressurizing the vessel with process gas and supercritical fluid to the higher supercritical pressure while heating the interior to supercritical temperature so as to displace all other gases with supercritical fluid without entering a liquid phase condition.

(e) Filling the vessel with the supercritical fluid mixture so as to replace the supercritical fluid.

(f) Soaking the substrate at the higher supercritical pressure for a predetermined soak period, so as to infuse the materials to be removed with the supercritical fluid mixture under the higher supercritical pressure.

(g) Agitating the substrate by rapidly decompressing the vessel to the lower supercritical pressure so as to mechanically stress the material to be removed with the pressure differential, and flushing the vessel with supercritical fluid or supercritical fluid mixture for a predetermined period of time to wash out the loosened debris and particulate matter, and then preferably rapidly elevating the vessel pressure back to the higher supercritical pressure to further stress the remaining materials to be removed.

(h) Rinsing the substrate with supercritical fluid preferably at the higher supercritical pressure, although lower supercritical pressures may be suitable under some circumstances.

(i) Drying the substrate with supercritical fluid and process gas by maintaining the vessel at supercritical temperature when decreasing vessel pressure to ambient without entering a liquid phase condition. And then, (j) Opening the vessel and unloading the substrate. Opening and closing may incorporate a low pressure outgassing of process gas to facilitate removal of any remaining particulate matter through the lid opening.

As in the previous embodiment, various alternatives to the basic step sequence and vessel configuration may be incorporated to further enhance the cleaning effect.

It will be readily apparent to those skilled in the art that there are other and various embodiments within the scope of the invention as disclosed and illustrated in the figures, and in the claims that follow.

We claim:

1. A supercritical fluid cleaning process for cleaning precision surfaces comprising the steps:
    (a) selecting process materials comprising a process gas which is convertible at a critical point of temperature and pressure to a supercritical fluid for said cleaning process,
    (b) selecting supercritical fluid operating parameters for said process gas including a supercritical temperature, a lower supercritical pressure, and a higher supercritical pressure, said higher supercritical pressure being preferably at least twice said lower supercritical pressure,
    (c) loading, closing and scaling at least one substrate with a said precision surface in a pressure vessel, said vessel being connected to a source of said process gas and a source of said supercritical fluid and having at least one port for exhausting byproducts of said process, said vessel configured with means for heating the interior thereof and having independent means for isolating said vessel from inflow of said process materials and outflow of said byproducts,
    (d) purging and pressurizing said vessel with process gas and supercritical fluid to said higher supercritical pressure while heating said interior to said supercritical temperature so as to displace all other gases with supercritical fluid without entering a liquid phase condition,
    (e) soaking said substrate at said higher supercritical pressure for a predetermined soak period,
    (f) agitating said substrate by rapidly decompressing said vessel to said lower supercritical pressure and flushing said vessel with said supereritical fluid for a predetermined period of time, then rapidly elevating said vessel to said higher supercritical pressure,
    (g) rinsing said substrate at said higher supercritical pressure,
    (h) drying said substrate with supercritical fluid and process gas by maintaining said vessel at supercritical temperature when decreasing vessel pressure to ambient, and
    (i) opening said vessel and unloading said substrate.

2. A supercritical fluid cleaning process according to claim 1, said vessel being also connected to a source of supercritical fluid mixture comprising said supercritical fluid and selected additives in solution, said process further comprising additional step (d.1) filling said vessel with said supercritical fluid mixture so as to replace said supercritical fluid, and in said step (f) said flushing said vessel with said supercritical fluid comprising said supercritical fluid mixture.

3. A supercritical fluid cleaning process according to claim 2, further comprising at least one repetition of steps (e) and (f) sequentially for at least two iterations during said process.

4. A supercritical fluid cleaning process according to claim 2, further comprising at least one repetition of steps (d.1) through (f).

5. A supercritical fluid cleaning process according to claim 1, said process materials comprising carbon dioxide.

6. A supercritical fluid cleaning process according to claim 1, said process being conducted as repetitive cycles with a processed substrate being unloaded and a new said substrate being loaded for each consecutive cycle.

7. A supercritical fluid cleaning process according to claim 1, said vessel configured as an inverted vessel with an underside vertically operated lid upon which said substrate is mounted for said processing.

8. A supercritical fluid cleaning process according to claim 2, said means for heating the interior comprising at least one heat exchanger platen in said vessel.

9. A supercritical fluid cleaning process according to claim 8, said at least one heat exchanger platen comprising upper and lower platens between which said substrate is supported during said process.

10. A supercritical fluid cleaning process according to claim 2, said step (c) comprising loading and processing said substrate with said precision surface facing downward.

11. A supercritical fluid cleaning process according to claim 2, said vessel configured for reversing the direction of flow of said process materials.

12. A supercritical fluid cleaning process according to claim 2, said vessel being also connected to a source of a process gas mixture of said process gas and selected additives.

13. A supercritical fluid cleaning process according to claim 12, said vessel being also connected to a source of process gas in liquid state.

14. A supercritical fluid cleaning process for cleaning precision surfaces comprising the steps:
    (a) selecting process materials comprising carbon dioxide as a process gas which is convertible at a critical point of temperature and pressure to a supercritical fluid for said cleaning process, and additives soluble in said process gas,
    (b) selecting supercritical fluid operating parameters for said process gas including a supercritical temperature, a lower supercritical pressure, and a higher supercritical pressure, said higher supercritical pressure being preferably at least twice said lower supercritical pressure,
    (c) loading, closing and scaling at least one substrate with a said precision surface in a pressure vessel, said vessel being connected to a source of said process gas and a source of said supercritical fluid and a source of supercritical fluid mixture comprising said supercritical fluid and said additives, and having at least one port for exhausting byproducts of said process, said vessel configured with upper and lower heat exchanger platens for heating the interior thereof and having independent means for isolating said vessel from inflow of said process materials and outflow of said byproducts,
    (d) purging and pressurizing said vessel with process gas and supercritical fluid to said higher supercritical pressure while heating said interior to said supercritical temperature so as to displace all other gases with supercritical fluid without entering a liquid phase condition, (e) filling said vessel with said supercritical fluid mixture so as to replace said supercritical fluid, (f) soaking said substrate at said higher supercritical pressure for a predetermined soak period, (g) agitating said substrate by rapidly decompressing said vessel to said lower supercritical pressure and flushing said vessel with said supercritical fluid for a predetermined period of time, then rapidly elevating said vessel to said higher supercritical pressure, (h) rinsing said substrate with said supercritical fluid at said higher supercritical pressure, (i) drying said substrate with supercritical fluid and process gas by maintaining said vessel at supercritical temperature when decreasing vessel pressure to ambient without entering a liquid phase condition, (j) opening said vessel and unloading said substrate.

15. A supercritical fluid cleaning process according to claim 14, further comprising at least one repetition of steps (g) and (h) sequentially for at least two iterations thereof during said process.

16. A supercritical fluid cleaning process according to claim 14, further comprising at least one repetition of steps (e) through (h).

17. A supercritical fluid cleaning process according to claim 14, said process being conducted as repetitive cycles with a processed said substrate being unloaded and an unprocessed said substrate being loaded for each consecutive cycle.

18. A supercritical fluid cleaning process according to claim 14, said vessel configured as an inverted vessel with an underside vertically operated lid upon which said substrate is mounted for said processing.

19. A supercritical fluid cleaning process according to claim 14, said step (c) comprising loading and processing said substrate with said precision surface facing downward.

20. A supercritical fluid cleaning process according to claim 14, said vessel configured for reversing the direction of flow of said process materials.

21. A supercritical fluid cleaning process according to claim 14, said vessel further comprising a divergent inflow channel and a convergent outflow channel.

22. A supercritical fluid cleaning process according to claim 14, said vessel being also connected to a source of a process gas mixture of said process gas and said additives.

23. A supercritical fluid cleaning process according to claim 14, said vessel being also connected to a source of liquid carbon dioxide.

24. A supercritical fluid cleaning process for cleaning precision surfaces comprising the steps:

(a) selecting process materials comprising carbon dioxide as a process gas which is convertible at a critical point of temperature and pressure to a supercritical fluid for said cleaning process, and additives soluble in said process gas, (b) selecting supercritical fluid operating parameters for said process gas including a supercritical temperature, a lower supercritical pressure, and a higher supercritical pressure, said higher supercritical pressure being preferably at least twice said lower supercritical pressure, (c) loading, closing and sealing at least one substrate with a said precision surface in a pressure vessel, said vessel being connected to a source of said process gas and a source of said supercritical fluid and a source of supercritical fluid mixture comprising said supercritical fluid and said additives, and having at least one port for exhausting byproducts of said process, said vessel configured as an inverted vessel with an underside vertically operated lid upon which said substrate is mounted for said processing, said vessel further comprising a divergent inflow channel and a convergent outflow channel, said vessel configured with upper and lower heat exchanger platens for heating the interior thereof and having independent means for isolating said vessel from inflow of said process materials and outflow of said byproducts, (d) purging and pressurizing said vessel with process gas and supercritical fluid to said higher supercritical pressure while heating said interior to said supercritical temperature so as to displace all other gases with supercritical fluid without entering a liquid phase condition, (e) filling said vessel with said supercritical fluid mixture so as to replace said supercritical fluid, (f) soaking said substrate at said higher supercritical pressure for a predetermined soak period, (g) agitating said substrate by rapidly decompressing said vessel to said lower supercritical pressure and flushing said vessel with said supercritical fluid for a predetermined period of time, then elevating said vessel to said higher supercritical pressure, (h) rinsing said substrate with said supercritical fluid at said higher supercritical pressure, (i) drying said substrate with supercritical fluid and process gas by maintaining said vessel at supercritical temperature when decreasing vessel pressure to ambient without entering a liquid phase condition, (j) opening said vessel and unloading said substrate.

25. A supercritical fluid cleaning process according to claim 24, further comprising at least one repetition of steps (g) and (h) sequentially for at least two iterations thereof during said process.

26. A supercritical fluid cleaning process according to claim 24, further comprising at least one repetition of steps (e) through (h).

27. A supercritical fluid cleaning process according to claim 24, said process being conducted as repetitive cycles with a processed said substrate being unloaded and an unprocessed said substrate being loaded for each consecutive cycle.

* * * * *